United States Patent

Dick et al.

[11] Patent Number: 5,997,948
[45] Date of Patent: Dec. 7, 1999

[54] PROCESS FOR PRODUCING A DEPOSIT COMPRISING SILICA ON THE SURFACE OF A GLASS PRODUCT

[75] Inventors: Sami Dick, Le Chesnay; Bernard Genies, Bures sur Yvette; Lahcen Ougarane, Montigny le Bretonneux; Patrick Recourt, Marcoussis, all of France

[73] Assignee: L'Air Liquide, Societe Anonyme pour l'Etude et l'Exploitation des Procedes Georges Claude, Paris Cedex, France

[21] Appl. No.: 08/348,820

[22] Filed: Nov. 28, 1994

Related U.S. Application Data

[63] Continuation of application No. 08/190,241, Feb. 1, 1994, abandoned, which is a continuation of application No. 07/913,008, Jul. 14, 1992, abandoned.

[30] Foreign Application Priority Data

Jul. 31, 1991 [FR] France .................................. 91 09717

[51] Int. Cl.⁶ .................................................. C23C 16/22
[52] U.S. Cl. ................................ 427/255.11; 427/255.18; 427/255.37; 427/255.5
[58] Field of Search .............................. 427/255, 255.1, 427/255.3, 255.5, 255.11, 255.18, 255.37

[56] References Cited

U.S. PATENT DOCUMENTS

| 3,681,132 | 8/1972 | Pammer et al. ............. 427/255.3 |
| 4,105,810 | 8/1978 | Yamazaki et al. .............. 427/79 |
| 4,485,146 | 11/1984 | Mizuhashi et al. ............ 428/428 |

FOREIGN PATENT DOCUMENTS

| 0213045 | 3/1987 | European Pat. Off. . |
| 53-54181 | 5/1978 | Japan . |
| 1-132769 | 5/1989 | Japan . |

*Primary Examiner*—Shrive Beck
*Assistant Examiner*—Brett Chen
*Attorney, Agent, or Firm*—Young & Thompson

[57] ABSTRACT

A deposit of a silica base layer is formed on the surface of a glass product by projecting on a hot surface of the product, in a non confined ambient atmosphere, a gaseous mixture having a silane content lower than 2%, an oxygen content between 3.5 and 30%, and advantageously a hydrogen content lower than 5%. The surface of the object to be treated is advantageously heated immediately before being sent to the injection station.

8 Claims, 1 Drawing Sheet

PROCESS FOR PRODUCING A DEPOSIT COMPRISING SILICA ON THE SURFACE OF A GLASS PRODUCT

This application is a continuation of application Ser. No. 08/190,241, filed Feb. 1, 1994 abandoned, which is a continuation of application Ser. No. 07/913,008, filed Jul. 14, 1992, now abandoned.

BACKGROUND OF INVENTION (a) Field of Invention

The present invention concerns processes for producing a deposit comprising silica on a surface of a glass product by projecting a gaseous mixture comprising a major portion of a neutral gas, a precursor of silicon and oxygen on the hot surface of the product by means of at least one projection nozzle.

(b) Description of Prior Art

A process of this type is known from the document U.S. Pat. No. 3,717,498 according to which the projection is carried out in a confined manner in a tube. More recently, the document GB-A-2.234.264 describes a similar process, for flat glass, where the injection is carried out in a coating chamber which covers the zone to be coated, the chamber being enclosed in a suction hood provided with sealing skirts.

SUMMARY OF INVENTION

It is an object of the present invention to propose a process of the above type, which is for example suitable for the formation on the surface of a glass product, such as sodium-calcium or fluorosilicate, of anti-migratory barrier layers, in particular of sodium on sodium-calcium glasses, and for increasing the resistance of the glass product to alkaline media, such as against detergent products, enabling to carry out in a simple and a particular flexible manner deposits of quality on a large number of glass products, and resulting by this fact in substantially reduced costs of installation and production.

For this purpose, according to a characteristic of the invention, the projection is carried out on the hot surface of the glass product in a non confined ambient atmosphere, typically in free air.

According to a more specific characteristic of the invention, the content of silicon precursor, typically a silane, in the gaseous mixture is between 0.5 and 2%, typically about 1%, the oxygen content in the gaseous mixture is between 3.5 and 30%, typically between 7 and 15%.

According to another characteristic of the invention, hydrogen, at a content typically lower than 5%, is added to the gaseous mixture to be projected.

According to more specific characteristics of the invention, the hydrogen content in the gaseous mixture is between 0.1 and 5%, typically higher than 2% and advantageously about 3%, the content of the silicon precursor, typically a silane, advantageously monosilane, is between 0.1 and 2%, advantageously about 1%, the oxygen content in the gaseous mixture is between 3.5 and 30%, the volume ratio between oxygen and the silicon precursor being preferably between 5 and 20, typically higher than 7, the volume ratio between hydrogen and silane being preferably higher than 2, typically about 3.

According to another characteristic of the invention, the glass surface to be treated is selectively heated immediately before the projection of the gaseous mixture, in free air, on the heated surface.

The Applicant has observed that, surprisingly, under the above-mentioned conditions, the projection in free air of the gaseous mixture on the hot glass surface (at a temperature between about 300° and the temperature of formation of the glass), gives a deposit of a homogeneous, uniform, non granular and stoichiometric layer of silica or hydrogenated silica without occurrence of substantial redeposition of isolated particles containing silica on this layer.

BRIEF DESCRIPTION OF DRAWINGS

The present invention will be better understood from the following description of embodiments, given by way of illustration but without limitations, with reference to the annexed drawings, in which.

DESCRIPTION OF PREFERRED EMBODIMENTS

Figure 1:
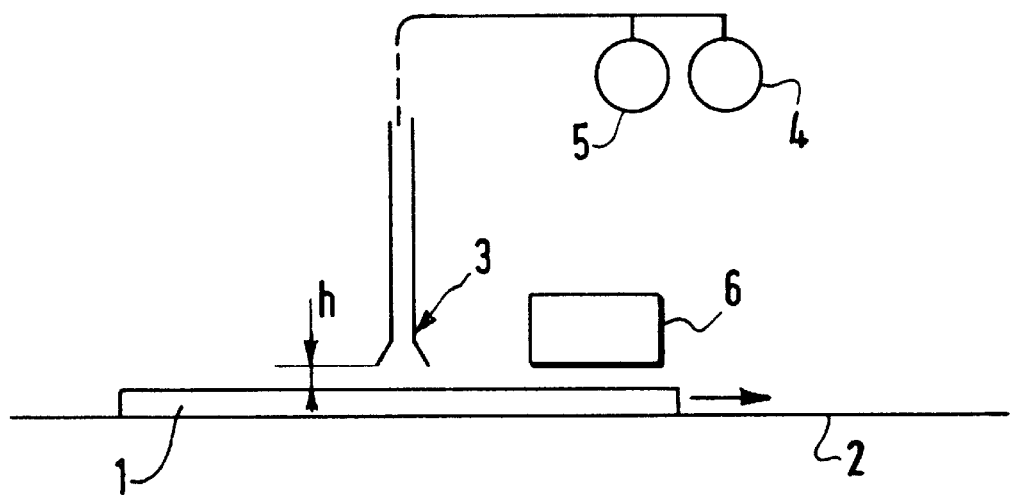
FIG. 1 is a schematic view of a first embodiment of an apparatus for carrying out the process according to the invention.

FIG. 1 schematically represents a glass plate 1 which is sent to free air on a carrying band 2 along the trajectory of which there is disposed a projection nozzle 3 of a ternary mixture of silane-oxygen-nitrogen for the formation, on the upper surface of the plate 1, of a layer of silica. In this embodiment, nozzle 3 defines a projection slit which is transverse to the direction of relative advance of the plate 1 and is supplied with ternary mixture from a container 4 containing a binary mixture of nitrogen and silane and a reservoir 5 of gaseous oxygen. The projection nozzle 3 may be disposed directly downstream of a floatation furnace from which the glass plate 1 exits at the required temperature. The projection station may however be provided independently of any furnace, in which case, typically, a heating station 6, for example with infrared, will be disposed immediately upstream of the projection station in the direction of movement of plate 1.

In this embodiment, the distance h between the end of nozzle 3 and the surface of the plate to be coated is shorter than 15 mm, and is typically between 3 and 10 mm, the speed of ejection of the mixture being between 5 and 30 m/second, depending on the width of the slit.

The silane content of the gaseous mixture is between 0.5 and 2%, preferably between 0.8 and 1%, the oxygen content of the gaseous mixture is between 3.5 and 30%, preferably between 7 and 15%, the oxygen/silane volume ratio being between 5 and 30, typically between 7 and 15, preferably between 7 and 10.

Under these conditions, with a relative speed of movement between the plate and the nozzle of 5 cm/second and a number of consecutive passages corresponding to a true time of injection on an elementary zone of the plate heated at a temperature between 550° C. and 600° C., of about 9 seconds, there is obtained a layer of stoichiometric silica of uniform thickness of about 0.7 $\mu$m having a number of non bonded redeposited particles having a dimension not exceeding 0.2 $\mu$m, lower than 10/mm$^2$. Instead of nitrogen, similar results are obtained with argon which enables to reduce slightly the duration of projection of the gaseous mixture to give an efficient barrier layer. A test of resistance against alkaline media (alkaline attack, during 15 minutes, with a boiling solution containing 0.5 mole/liter of Na$_2$CO$_3$ and one mole/liter of NaOH, followed by a second attack lasting 15 minutes, with the same boiling solution), and a measurement of the intensities of fluorescence X show a resistance of the layer of silica to a basic attack, not lower than 30 minutes.

According to another aspect of the invention, to the gaseous mixture of neutral gas, silane and oxygen, there is added between 0.1 and 5% hydrogen without substantially modifying the operating conditions except that the gaseous mixture containing hydrogen is maintained, until its ejection, at a temperature lower than 200° C., typically lower than 150° C., and is projected into free air against the surface to be treated during at least 2 seconds, typically between 5 and 20 seconds depending on the shape and intended utility of the glass product. The surface of the glass to be treated is, here also, previously heated at a temperature between 300° C. and glass forming or crystal forming temperature, typically at a temperature between 500 and 600° C.

The gaseous mixture consists mostly of a neutral diluting gas, such as nitrogen or argon. The gaseous precursor of silicon is advantageously a silane, such as monosilane, disilane or trisilane. The silane content of the gaseous mixture varies between 0.1% and the lower limit of flammability of silane depending on the other components of the gaseous mixture, for example 3% in the case of monosilane with nitrogen as diluting gas. The oxygen content is between 3.5 and 30%. The hydrogen content varies between 0.1% and the lower limit of flammability of hydrogen under the conditions of the process.

The table hereinbelow shows the performances of the hydrolytic resistance of deposits of silica or hydrogenated silica base layers obtained according to the invention under various operating conditions. The test applied is the following: a flask of sodium-calcium glass, in which a gaseous mixture according to the invention has been injected to produce a silica base layer, is filled with distilled water, then is heated at 8° C. during 48 hours. Sodium which is extracted from glass is thereafter measured, for example by flame spectrometry.

| Migration of sodium in μg/ml: | | |
|---|---|---|
| Time of treatment | 5 s | 15 s |
| Reference not treated | 8 | 8 |
| Treatment A | 4 | |
| Treatment B | 2.58 | 0,5 |
| Treatment C | 2.32 | 0,1 |

Operating Conditions:
   temperature of glass: 570° C.
   flow of gaseous mixture: 100 l/h
   treatment A: SiH4: 1%, O2: 7% N2: 92%
   treatment B: SiH4: 1%, O2: 7%, H2: 3%: N2: 89%
   treatment C: SiH4: 1%, O2: 16%, H2: 3%, N2: 80%

It will be noted that as compared to treatment A, which corresponds to the process without hydrogen described above, which already divided in two the quantity of migrating sodium, is compared to a non treated reference, the process utilizing hydrogen enables to divide this quantity by more than three, with a time of treatment of 5 seconds, and by more than 15, with a time of treatment of 15 seconds.

The high simplicity of the process according to the invention, enabling to make the deposits in free air, enables a large number of applications to glass products of different shapes, with variable layer thicknesses depending on time and speed of injection of the gaseous mixture, the content of silane, oxygen and hydrogen of the mixture, and the temperature of the surface to be treated.

Figure 2:
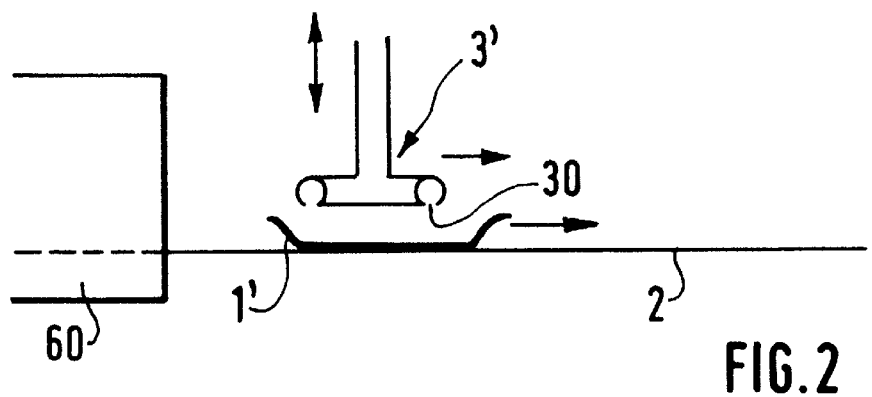
FIGS. 2 and 3 are schematic views of other embodiments of the invention.

FIG. 2 represents the application of the process to the coating of the internal surface of a saucer or a plate 1' which exits from a heating furnace 60. In this embodiment, the injection nozzle 3' is shaped as a torus including a circular injection slit 30 of a diameter adapted to that of the saucer 1', nozzle 3' being lowered above the saucer 1' at its exits from the shaping or heating furnace 60, and accompanying the movement of the latter for a duration between 3 and 20 seconds, depending on the thickness of the desired deposited layer. The nozzle may also have a porous ejection surface of a size and shape which strictly corresponds to those of the product to be treated. The same gaseous mixtures as previously are used.

Figure 3:
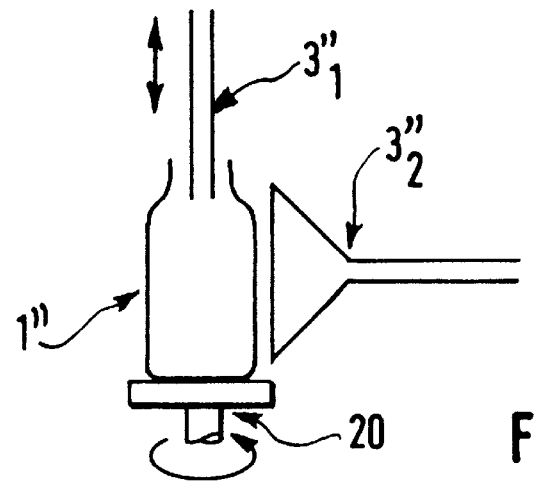

In the embodiment of FIG. 3, the glass product to be coated consists here of a flask 1" which, while still hot, is placed on a rotary support 20. A first cylindrical nozzle 3"$_1$ is introduced in the neck of the flask 1" while a second nozzle 3"$_2$ having an ejection slit which is parallel to a generator of the flask 1" is disposed in the vicinity of the outer wall of the latter. The same gaseous mixtures as previously are ejected by the two nozzles 3"$_1$ and 3"$_2$, the time of injection inside the flask being between 3 and 5 seconds, which enables an easy integration in a chain of industrial production.

Although the present invention has been described with respect to specific embodiments, it is not limited thereto but on the contrary is capable of modifications and variants which will appear to one skilled in the art.

We claim:

1. A method of forming a silica-based alkali barrier layer on a surface of a glass article comprising the steps of:

providing an at least ternary gaseous mixture comprising a major portion of a neutral gas, a gaseous precursor of silicon and oxygen;

heating at least the surface of the glass article to a temperature not less than 300° C.;

positioning the heated surface of the glass article at a distance less than 15 mm from a nozzle having a projection slit; and projecting the gaseous mixture through the nozzle onto the heated surface transversely to the surface at atmospheric pressure to form the barrier layer while causing relative movement between the article and the nozzle in a direction transverse to the slit.

2. The method of claim 1, wherein the projection slit is shaped to conform to the shape of the surface.

3. The method of claim 2, wherein the glass article is a container.

4. The method of claim 3, wherein the glass article has a shape of a cup.

5. The method of claim 2, wherein the glass article has the shape of a plate.

6. The method of claim 1, wherein the gaseous mixture further comprises 0.1 to 5% hydrogen as $H_2$.

7. The method of claim 1, wherein the silicon precursor content in the gaseous mixture is about 0.1 and 2%.

8. The method of claim 1, wherein the oxygen content in the gaseous mixture is between about 3.5 and 30%.

* * * * *